United States Patent [19]

Kawakami et al.

[11] Patent Number: 5,038,713

[45] Date of Patent: Aug. 13, 1991

[54] MICROWAVE PLASMA TREATING APPARATUS

[75] Inventors: Soichiro Kawakami, Nagahama; Masahiro Kanai, Tokyo; Takayoshi Arai; Tsutomu Murakami, both of Nagahama, all of Japan

[73] Assignee: Canon Kabushiki Kaisha, Tokyo, Japan

[21] Appl. No.: 354,856

[22] Filed: May 22, 1989

[30] Foreign Application Priority Data

May 25, 1988 [JP] Japan ................ 63-125794

[51] Int. Cl.$^5$ .................... C23C 16/50
[52] U.S. Cl. .................... 118/723; 156/345; 156/643; 315/111.71; 427/39; 427/45.1
[58] Field of Search ........... 118/719, 723; 156/345, 156/643; 204/164; 219/10.55 A, 10.55 F, 10.55 R; 315/39, 111.21, 111.41, 111.71; 427/39, 45.1

[56] References Cited

U.S. PATENT DOCUMENTS

| | | | |
|---|---|---|---|
| 4,138,306 | 2/1979 | Niwa | 204/164 |
| 4,207,452 | 6/1980 | Arai | 219/10.55 A |
| 4,689,459 | 8/1987 | Gerling | 219/10.55 F |
| 4,831,963 | 5/1989 | Saito et al. | 118/723 |
| 4,866,346 | 9/1989 | Gaudreau et al. | 315/111.21 |

FOREIGN PATENT DOCUMENTS

63-100186  5/1988  Japan ................ 118/723

Primary Examiner—Shrive Beck
Assistant Examiner—Terry J. Owens
Attorney, Agent, or Firm—Fitzpatrick, Cella, Harper & Scinto

[57] ABSTRACT

A microwave plasma treating apparatus comprising a vacuum vessel, a device for introducing a microwave to the inside of the vacuum vessel by way of a microwave transmission circuit, a device for supplying a starting gas to the inside of the vacuum vessel, a device for evacuating the inside of the vacuum vessel, and a specimen holder for maintaining a specimen substrate to the inside of the vacuum vessel, wherein a cavity resonator integrated with two matching circuits is disposed in the microwave transmission circuit and a magnetic field generator is disposed to the outside of the cavity resonator, and having the following main features: (a) matching facilitated by a plunger for adjusting the axial length of the cavity resonator and cylindrical sling type irises, E-H tuner or three-stub tuner disposed at the portion of the cylindrical cavity resonator where the microwave is introduced, (b) a bell jar disposed within the cavity resonator to excite TM mode and (c) a magnetic field generator disposed to the outside of the cavity resonator to prepare a region of a great magnetic flux density in the discharging space at the inside of the cavity resonator.

8 Claims, 8 Drawing Sheets

MICROWAVE PLASMA TREATING APPARATUS

FIELD OF THE INVENTION

The present invention relates to a microwave plasma treating apparatus and a control system therein. More specifically, it relates to an improved microwave plasma treating apparatus suitable for forming a deposited film and etching an object.

BACKGROUND OF THE INVENTION

There are known a number of plasma chemical vapor deposition methods (hereinafter referred to as "plasma CVD method") and a number of apparatuses for practicing those plasma CVD methods (hereinafter referred to as "plasma CVD apparatus").

As for the plasma CVD methods, as they have advantages such as (i) capable of forming a deposited film at a low temperature of from 200° to 400° C., (ii) requiring no heat resistance for a substrate, etc. In view of this, they have been applied for the formation of a silicon dioxide film or a silicon nitride film which is usable as an insulating film in semiconductor systems, an amorphous silicon (a-Si) film which is usable in solar cells, close-contact type image sensors or photosensitive drums, a diamond thin film, etc. As for the plasma CVD apparatuses, there has been predominantly used a radiowave (RF) plasma CVD apparatus that RF is introduced between two flat plate type electrodes opposed in parallel with each other, thereby forming a plasma. And for such RF plasma CVD apparatus, it has a merit that its size may be easily modified because of their simple structure.

However, the conventional RF plasma CVD method involves the following drawbacks on the other hand. That is, ion sheath is apt to form on the side of a substrate to develop a negative self-bias, by which ion species in the plasma is drawn to the cathode to moderate the incident impact shock of the ion species to the anode on which the substrate is disposed. However, the ion species is still applied to the surface of the substrate and mixed into the deposited film to bring about internal stresses or increase the defect density, failing to obtain a deposited film of good quality. In addition, since the electron density is as low as from $10^8$ to $10 cm^{-3}$ decomposing efficiency of the starting material gas is not so high and the deposition rate is low. Further in addition, since the electron temperature is as low as $-4$ eV, starting material gas of high bonding energy such as silicon halide compound is less decomposable.

For improving the above-mentioned drawbacks of the RF plasma CVD method, there have been proposed, in recent years, several plasma treating methods and apparatuses used therefor using a microwave of about 2.45 MHz capable of efficiently forming a high density plasma and, at the same time, heating an object to be treated. And studies have been made on the method of depositing a thin film such as silicon dioxide, silicon nitride, a-Si, diamond, etc. as well as an etching method for the silicon film.

Incidently, conventional microwave plasma treating apparatuses are classified roughly into two types.

One of them is of a type as disclosed in Japanese Patent Publication Nos. 58-49295 and 59-43991 and Japanese Utility Model Publication No. 62-36240, in which a gas pipe is inserted through or placed in contact with a rectangular or coaxial waveguide to form a plasma (hereinafter referred to as "type 1 MW-plasma treating apparatus").

The other one is a type as disclosed in Japanese Patent Laid-Open No. 57-133636, in which electron cyclotron resonance (ECR) is established within a cavity resonator and a plasma is drawn out by a divergent magnetic field (hereinafter referred to as "type 2 MW-plasma treating apparatus").

Figure 3:
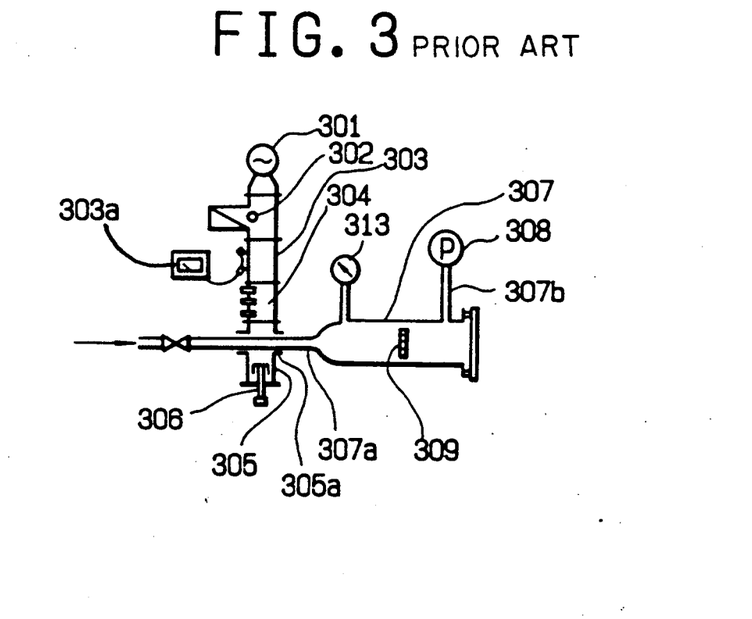
FIG. 3 and FIG. 4 are, respectively, schematic constitutional views of conventional microwave plasma treating apparatus.

FIG. 3 shows a typical type 1-MW-plasma treating apparatus (refer to Japanese Utility Model Publication No. (62-36240).

That is, the type 1 MW-plasma treating apparatus comprises a vacuum system, an exhaust system and a microwave introducing system as shown in FIG. 3.

Referring to FIG. 3, the exhaust system comprises an exhaust pipe 307B and an exhaust pump 308. The vacuum system comprises a reactor 307, the exhaust system and vacuum gauge 313. The reactor 307 connects to a first gas introducing pipe 307a including a microwave transmissive tube (for example, made of quartz tube) having an inside diameter on the order of 40 mm.

The microwave introducing system comprises a microwave waveguide connected to a microwave power source 301, and isolator 302, microwave power monitor 303 for detecting reflected electric energy provided with an indicator 303a, impedance matching unit 304, shielding pipe 305a, a sliding short-circuit plate 305, i.e. a plunger 306.

The microwave transmissive quartz tube is connected to the gas introducing pipe 307a and is arranged perpendicularly to the microwave waveguide.

A second gas introducing pipe (not shown) is connected to the inside of the reactor 307 and a gas (silane gas) supplied is exhausted through an exhaust system (307b and 308). In the apparatus, the gas introduced through the first gas introducing pipe ($O_2$ gas or $N_2$ gas) is converted into plasma by microwave discharge. During microwave discharge caused by microwave energy, microwave input impedance can be matched by moving a plunger 306.

Radicals of the plasma thus produced react with the silane gas supplied through the second gas introducing pipe whereby a silicon dioxide film or a silicon nitride film is formed on the surface of the substrate 309.

Figure 4:
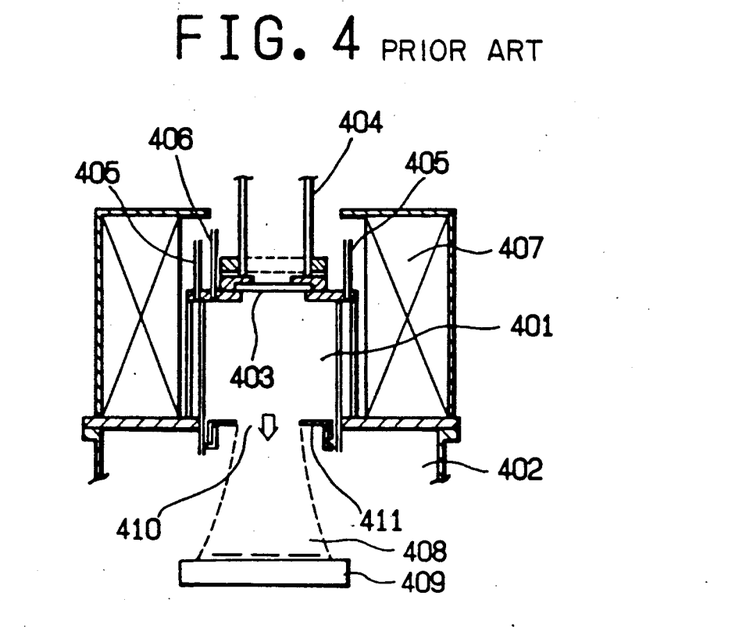

FIG. 4 shows a typical type 2 MW-plasma treating apparatus (refer to Japanese Patent Laid-Open No. 57-133636). The system and configuration of this apparatus are the same as those of the foregoing type 1 MW-plasma treating apparatus except for the discharging space for which an electromagnet 407 is used. That is, the vacuum system comprises a cylindrical plasma producing vessel 401 and a reactor 402 connected thereto, in which a microwave introducing window 403 is attached hermetically to the plasma producing vessel. A first gas introducing pipe 406 and a microwave waveguide 404 are connected to the plasma producing vessel 401. The plasma producing vessel 401 is watercooled by means of a water-cooling pipe 405 disposed at the outer circumference thereof. The apparatus shown in FIG. 4 is provided with an electromagnet 407 disposed coaxially with the plasma producing vessel 401. The direction of lines of magnetic force from the electromagnet 407 is the same as the travelling direction of the microwave. Electrons move for a magnetron motion by the combination of a magnetic field and an electric field formed by the microwave in the perpendicular direction. Therefore, the plasma producing vessel 401 is designed as a cavity resonator of a $TE_{11t}$ mode (t=a natural number). A second gas introducing pipe and the exhaust system are connected to the reactor 402, and gases within the deposition vessel are exhausted by the exhaust system.

When the typical type 2 MW-plasma treating apparatus shown in FIG. 4 is used, for example, as a deposition apparatus a gas ($H_2$ gas) introduced through the first gas introducing pipe 406 is formed into a plasma by electric discharge caused by the microwave energy. When the magnetic flux density of the magnetic field is 875 gauss, the reflected wave of the microwave energy is almost zero. In this apparatus, the end plate 411 of the cavity resonator having the construction of a choke is moved under vacuum depending on the type of the gas, the pressure of the gas and the microwave power applied, so that the cavity resonator meets required conditions. Radicals in the plasma are transported under an electron cyclotron motion in the direction of the lines of magnetic force, and the radicals in the plasma react with the gas (silane gas) introduced through the second gas introducing pipe to form an a-Si film over the surface of a substrate 408.

However, both the type 1 MW-plasma treating apparatus and the type 2 MW-plasma treating apparatus have the following problems to be solved.

That is, the type 1 MW-plasma treating apparatus involves the following drawbacks; (i) it is necessary to control the pressure during electric discharge to an order of about 0.05 Torr or higher, or to a gas of such a type as having a large ionizing cross sectional area easily causing electric discharge in order to attain stable discharge: and (ii) in the case where the apparatus is used for the film deposition, when the charged microwave power is increased in order to increase the film deposition rate, an electric field is concentrated to the junction between the quartz tube and the waveguide to cause sputtering to the quartz tube, by which impurities formed by the sputtering are mixed into the deposited film, failing to obtain a deposited film of satisfactory property.

On the other hand, the type 1 MW-plasma treating apparatus is free from the sputtering problem as described above and discharge even in a low pressure region of about $10^{-4}$ Torr is possible. However, there are the following problems upon forming, for example, an a-Si film by using a $H_2$ gas and a silane gas ($SiH_4$); (iii) an a-Si film is deposited on the microwave introducing window along with the progress of the depositing reaction making it difficult for impedance matching and maintenance of electric discharge: (iv) since the microwave introducing window 403 and the waveguide 404 are fastened and fixed, the end plate 411 has to be moved in vacuum for changing the axial length of the cavity resonator, thereby making the operation difficult: and (v) the weight of the apparatus is heavy and the cost is expensive since the apparatus uses coils for generating electric field under ECR conditions.

SUMMARY OF THE INVENTION

Accordingly, it is a principal object of the present invention to eliminate the foregoing various problems in the conventional microwave plasma treating apparatus, and provide an improved microwave plasma treating apparatus having satisfactory operationability and productivity and capable of efficiently producing desired thin film semiconductors such as of a-Si.

Another object of the present invention is to overcome the foregoing problems in the conventional microwave plasma treating apparatus and provide a microwave plasma treating apparatus capable of conducting dry etching to an object to be treated at good operationability and productivity.

A further object of the present invention is to provide a microwave plasma treating apparatus capable of stable electric discharge without using a large electromagnet as in the ECR system, in a low pressure region irrespective of the type of gas with small ionizing cross sectional area, while suppressing the reflected power, and at a low electric power.

The microwave plasma treating apparatus according to the present invention for attaining the foregoing objects has the following constitution:

That is, the microwave plasma treating apparatus comprising a vacuum vessel, means for introducing a microwave by way of a microwave transmission circuit to the inside of the vacuum vessel, means for supplying starting material gas to the inside of the vacuum vessel, means for evacuating the inside of the vacuum vessel and a specimen holder for maintaining a specimen substrate at the inside of the vacuum vessel, wherein a cavity resonator integrated with two matching circuits is disposed in the microwave transmission circuit and a magnetic field generator is disposed to the outside of the cavity resonator.

The main features of the apparatus according to the present invention resides in the following points (a) through (c). Specifically, (a) matching is facilitated by a plunger for adjusting the axial length of the cavity resonator and circuit by a cylindrical sliding type irises, introducing an E-H tuner or three-stub tuner disposed at the portion of the cylindrical cavity esonator for the microwave, (b) a penetrating bell jar into the cavity resonator to excite TM mode and (c) disposing a magnetic field generator to the outside of the cavity resonator to prepare a region of a high magnetic flux density in the electric discharging space at the inside of the cavity resonator.

According to the present invention, various problems in the conventional microwave plasma treating apparatus are dissolved and stable electric discharge can be made with effective utilization of the microwave power, free from the effect of the ionizing cross sectional area of the gas and the pressure of the gas.

In addition, the apparatus according to the present invention can be desirably used for effectively forming a desired functional deposited thin film or for dry etching an object, which enables one to form semiconductor films or insulating films respectively of good quality, or to produce various etched materials, with good productivity and at a reduced cost.

DESCRIPTION OF THE PREFERRED EMBODIMENT

The microwave plasma treating apparatus having the foregoing constitutions according to the present invention is to be explained below while mainly referring to the above-mentioned features (a), (b) and (c).

A constitution of the apparatus regarding the feature (a) can be attained by providing two matching circuits capable of being adjusted properly according to the phase and amplitude of a microwave. Since the energy of a standing wave is accumulated between the matching circuits and the cavity resonator, it is desirable that the distance between the matching circuits and the cavity resonator is reduced to the least possible extent. Most desirably, the matching circuits and the cavity resonator are integrated and at least one of the matching circuits is used as a plunger for varying the cavity length.

Incidentally, the phase and amplitude of the reflected microwave are dependent primarily on the plasma density and the morphology of a microwave feed circuit.

That is, the plasma density changes dependent on the kind of the gas, gas pressure or microwave power introduced and the complex refractive index n-ik ($0<n<1$; k is absorption coefficient) also changes correspondingly Accordingly, for always maintaining the function of the cavity resonator, the effects of n and k have to be nullified.

Since it is difficult to nullify the effect of n by varying the inside diameter of the cavity, the cavity length (L) of the cavity resonator may be increased by a length equivalent to the reduction of the inside diameter of the cavity to n times ($0<n<1$) the original length.

When the resonator frequency f (2.45 GHz), the resonance rst mode ($TM_{rst}$) the inside diameter (nD) of the cavity are known, the air equivalent value (L') of a new cavity length can be determined by the equation:

$$(2L')^2 = t^2/(f/c)^2 - (y_{rs}/nD)^2 \quad (1)$$

where $y_{rs}$ is the root of the Bessel function: $Jr(y)=0$, and c is the velocity of light.

As is obvious from the equation (1), the effect of n can be nullified by varying the length (L) of the cavity resonator according to the variation of n.

The effect of k, namely, the effects of the amplitude and phase lag δ of the reflected wave, can be nullified by adjusting the two matching circuits.

Practically, since n and k are dependent on each other, the length (L) of the cavity resonator and the position of sliding matching irises may be adjusted for one set of (n and k).

On the other hand, the reflected wave, which are dependent on the morphology of the microwave feed circuit, can be matched efficiently by using the two matching circuits.

Figure 1:
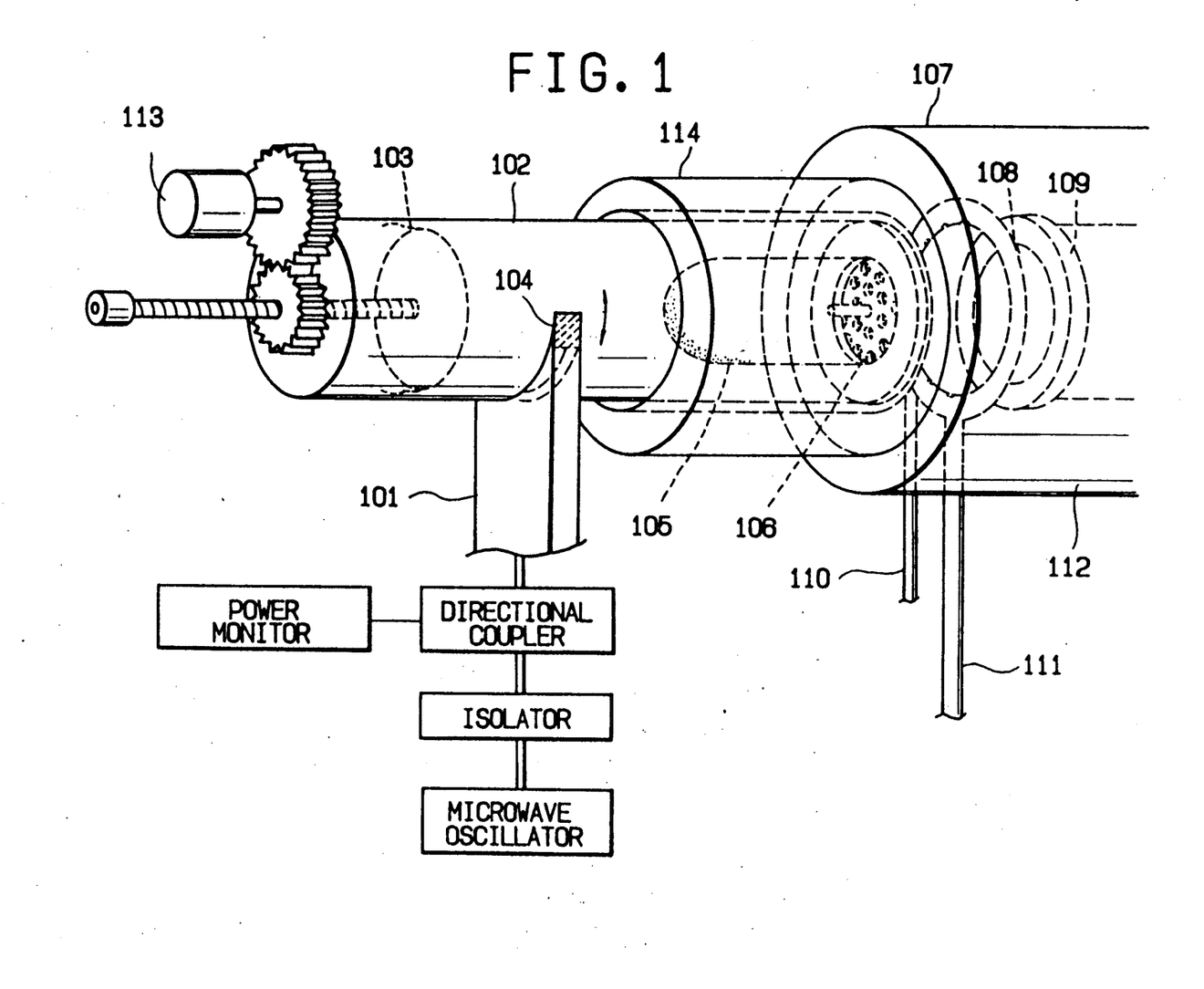
FIG. 1 is a schematic perspective view for a typical embodiment of a microwave plasma treating apparatus according to the present invention.

A constitution relating to the aforesaid feature (b) can be attained by connecting a rectangular waveguide and a cylindrical cavity resonator with the axes thereof intersecting each other at a right angle as shown in FIG. 1. When the waveguide and the cavity resonator are thus connected, an operation for varying the length of the cavity resonator is not obstructed by the waveguide. In the cylindrical cavity resonator, the microwave is driven in $TM_{01n}$ (n is a natural number), and the length of the cavity resonator can be changed even in the atmosphere, thereby facilitating the efficiency of operation.

A constitution regarding the aforesaid feature (c) can be attained by disposing a tubular cylindrical magnetic field generator to the outside of the cavity resonator, by which a region of high magnetic flux density can be formed in the electric discharging space at the inside of the cavity resonator. The magnetic field generator is generally classified into a permanent magnet and an electromagnet. Specifically, there are permanent magnets disposed in a coaxial manner as shown in FIGS. 2 (A) through (D), ring-like permanent magnets disposed as shown in FIGS. 2(E) and (F), and electromagnets comprising air-cored solenoid coils as shown in FIGS. 2(G) and (H). In each of FIGS. 2, the upper view is a side elevational view and the lower view is a top plan view each in a schematic manner, in which N and S mean magnetic poles. As the permanent magnet those having great coercive force and residual magnetic flux density are suitable and, among all, rare earth or ferrite series magnets are preferred. As the electromagnets, those having central magnetic flux density of greater than 50 gauss and, more preferably, greater than 100 gauss are desirable. Electromagnets are combined by one set in FIG. 2(G) and by two sets in FIG. 2(H). Particularly, in the embodiment shown in FIG. 2(H), it is possible to change the magnetic poles by changing the polarity of current for the two sets of electromagnets, thereby obtaining a mirror type or cusped type magnetic field.

It is not always necessary that the magnetic flux density in the electric discharging space of the magnetic field generator used for the microwave plasma treating apparatus according to the present invention is such a magnetic flux density as capable of obtaining electron cyclotron resonance relative to the frequency of the microwave. In the case of using the electromagnet, while it is necessary to increase the number of turns for the coils for increasing the maximum magnetic flux density produced, desired magnetic flux density can be obtained by controlling the electric current supplied thereto. In view of the above, it is more preferred to use a combination of permanent magnets if the importance is attached to the compactness and the cost reduction, and to use an electromagnet in the case where the importance is attached to the control of the magnetic flux density as the magnetic field generator of the microwave plasma treating apparatus.

In the present invention, using the magnetic field generator as described above, the performance of the microwave plasma treating apparatus is improved remarkably thereby enabling lowering the pressure during electric discharge, reducing the reflected power and saving in the electric power for maintaining the electric discharge.

The illustrated embodiment for the microwave plasma treating apparatus according to the present invention is to be explained more in details, but the present invention is no way restricted only thereto. For the sake of simplicity, although the explanation is made only to the case of using the cylindrical cavity resonator, the present invention is no way limited only thereto.

One embodiment for the apparatus according to the present invention is shown as a schematic perspective view in FIG. 1.

In FIG. 1, are shown a rectangular waveguide 101, a cylindrical cavity resonator 102, a plunger 103 for varying the length of the cavity resonator, cylindrical sliding matching irises 104, a microwave transmissive bell jar 105, a microwave reflector 106, a reaction vessel (or film-forming vessel) 107, a substrate 108, a substrate holder 109, gas introducing pipes 110, 111, a gas outlet 112, a driving device 113 for the plunger 103 for varying the axial length connected with a feedback control circuit from a power monitor, and a magnetic field generator 114, respectively.

Essentially, the apparatus shown in FIG. 1 is a microwave plasma treating apparatus of a cavity resonator type according to the present invention comprises a microwave oscillator (not shown), a microwave transmission circuit (not shown), a cavity resonator, and a reaction vessel provided with a microwave transmissive bell jar defining a plasma producing chamber, gas introducing pipes (110, 111) and a gas outlet 112.

In FIG. 1, the cylindrical cavity resonator 102 is preferably made of material having a low electric resistivity in order to decrease ohmic loss attributable to the surface current of a microwave. In addition, since the plunger for varying the length of the cavity moves under fitting with the cavity resonator, it has to be abrasion resistant. Accordingly, the cavity resonator is desirably made of material such as copper, brass and a silver-plated, copper-plated or gold-plated stainless steel. Among all, a silver-plated stainless steel is most suitable.

The cylindrical cavity resonator 102 and the rectangular waveguide 101 are joined together with the axes thereof intersecting each other at right angle to convert the $H_{10}$ ($TE_{10}$) mode of the rectangular waveguide 101 into the $E_{01}$ ($TM_{01}$) mode of a circular waveguide. The cavity resonator 102 is provided integrally with two matching circuits, namely, the plunger 103 for varying the length of the cavity resonator 102, and the cylindrical sliding matching irises 104.

The plunger 103 for varying the length of the cavity resonator 102 is movable along the axis of the cavity resonator 102. The plunger 103 may be driven, for example, by a motor 114. To prevent abnormal electric discharge between the cavity resonator 102 and the plunger 103, spring members made of phosphor bronze are used so that stable contact can be maintained.

A pair of right and left cylindrical sliding matching irises 104 are disposed respectively at the junction of the rectangular waveguide 101 and the cavity resonator 102. As indicated by an arrow in the figure, the irises are moved in the longitudinal direction of the rectangular waveguide 101 and the two irises are individually slidable along the cylindrical surface of the cavity resonator 102. The irises and the cavity resonator 102 are put into contact in a manner similar to that of the plunger.

To the outside of the cavity resonator 102, a magnetic field generator 114 selected from the embodiments shown in FIGS. 2(A) through (H) is disposed for forming a magnetic field in the discharging space of the bell jar.

The microwave transmissive bell jar 105 is disposed within the cavity resonator 102 (for example, 120 mm in inside diameter). The bell jar 105 is connected to the reaction vessel 107. An O-ring or a metallic sealing member for vacuum seal and the microwave reflector 106 are provided at the flange surface of the bell jar 105. A microwave is reflected by the microwave reflector 106, and the gas can flow between the interior of the bell jar 105 and that of the film-forming vessel 107.

The bell jar 105 is made of material such as quartz ($SiO_2$), alumina ($Al_2O_3$), boron nitride (BN) or silicon nitride (SiN).

The microwave reflector 106 is a perforated silver-, copper- or gold-plated metallic plate (a silver-plated metallic plate is particularly suitable) provided with a plurality of through holes, such as a perforated aluminum plate of 0.8 mm thickness having a plurality of circular holes of 6 mm in diameter and a ratio of hole area of 60 %, namely, a so-called punched board. The perforated plate is screwed to the reaction vessel 107 to suppress abnormal electric discharge. The microwave reflector may be made of an expanded metal instead of the perforated plate.

Disposed within the reaction vessel 107, are the substrate 108, the substrate holder 109 and the two gas introducing pipes 110 and 111. The extremity of the gas introducing pipe 110 penetrates through the microwave reflector 106 and opens into the interior of the bell jar 105. The other gas introducing pipe 111 has an annular extremity provided with a plurality of nozzle holes for jetting a gas. The pipe 111 is disposed between the bell jar 105 and the substrate holder 109.

The reaction vessel 107 is connected to a vacuum pump, not shown, for evacuating the reaction vessel.

Prior to the start of operation of the microwave plasma treating apparatus thus constructed in accordance with the present invention, the length of the cavity resonator is adjusted to a value slightly shorter than $m/2 \times \lambda$ (m: natural number) for easy starting of initial electric discharge. Concretely, the length of the cavity resonator is decided so that the cavity resonator functions with the bell jar 105 being disposed therein by previously measuring the network by a network analyzer (manufactured by Hewlett Packard Co.).

For example, when the bell jar is 3 mm in wall thickness, 70 mm in diameter and 100 mm in height, the decrement in the length of the cavity resonator is 3 mm and the length of the cavity resonator is 192 mm and, when the bell jar is 3 mm in wall thickness, 100 mm in diameter and 100 mm in height, the decrement in the length of the cavity resonator is 4 mm and the length of the cavity resonator 22 is 290 mm.

In the microwave plasma treating apparatus according to the present invention, the following advantageous effects can be obtained. That is, in a low pressure region of less than $10^{-2}$ Torr without using a magnetic field of great magnetic flux density as in ECR conditions, (i) stable electric discharge can be attained solely with such a type of gas as having relatively small ionizing cross sectional area, for example, $H_2$ or H, (ii) the electric power for maintaining the electric discharge can be reduced and (iii) the reflection power can be decreased.

Explanation is to be made for the method of operating the microwave plasma treating apparatus shown in FIG. 1, which illustrates one embodiment of the present invention.

At first, after evacuating the inside of the bell jar 105 and the film-forming chamber by way of a vacuum pump not illustrated to less than a predetermined pressure, the gas used for forming a plasma is introduced from the gas introduction pipe 110 or 111 into the bell jar 105, while a magnetic field is applied from the plasma forming device 114 (FIGS. 2(A) through (H)) and the microwave power applied from a microwave generator not illustrated is introduced by way of the waveguide 101 to the inside of the cavity resonator 102.

Successively, the axial length varying plunger and the cylindrical irises for the cavity resonator are controlled by the reflection power feedback control mechanism for restricting the reflection power of the power monitor for the microwave and causing stable electric discharge (E-H tuner or three-stub tuner may be used instead of the cylindrical irises). After operating for a certain period of time under this state, supply of the microwave power is interrupted and the operation is ended.

The microwave plasma treating apparatus according to the present invention can be used suitably as a thin film depositing apparatus and dry etching apparatus.

In the case of using the apparatus according to the present invention for the dry etching of an object to be treated, an etching gas is introduced from the gas introducing pipe 110 in the above-mentioned operating method to conduct etching. As the etching gas, $CF_4$, $C_2F_6$, $C_3F_3$, $C_4F_8$ (octafluorocyclobutane), $C_5F_{12}$, $CHF_3$, $CBrF_3$, $CCl_4$, $CCl_3F$, $CCl_2F_2$, $CClF_3$, $SF_6$, $NF_3$, $BCl_3$, $F_2$, $Cl_2$, $Br_2$, HF or HCl, or a gas mixture of the above-mentioned etching gas and $H_2$, $O_2$, $N_2$, He, Ne, Ar, Kr or Xe is used depending on the material to be etched. For example, there are generally used $CF_3+O_2$ for etching Si and $CF_4$ for $SiO_2$ etching. The inner pressure for the dry etching is preferably from $10^{-4}$ to $10^{-1}$ Torr.

In the case of using the apparatus according to the present invention for thin film deposition, there are two methods (a) and (b) in the above-mentioned operating method, that is, (a) a method of introducing film-forming starting gas from the gas introduction pipe 110 thereby forming a deposited film and (b) a method of introducing a plasma-forming starting gas from the gas introducing pipe 110 into the reaction vessel (film-forming vessel) 107 and introducing the film-forming starting gas from the gas introduction pipe 111 into the film-forming vessel 107, thereby forming a deposited film. The method for forming the deposited film is properly selected depending on the desired deposited film or the starting gas employed.

When the microwave treating apparatus according to the present invention is applied to the deposition of thin films, it is possible to form thin films of satisfactory quality such as of amorphous silicon, crystalline silicon, amorphous silicon germanium, silicon nitride, silicon oxide, amorphous silicon carbide, diamond and various kinds of organic high molecular compounds.

The gas used in the above-mentioned cases can be selected depending on the kind of deposited film as shown below.

That is, as the starting material gas for depositing a thin film of amorphous silicon or crystalline silicon, there can be mentioned those gases containing silicon atoms, for example, $SiH_4$, $Si_2H_6$, $SiF_4$, $SiHF_3$, $SiH_2F_2$, $SiH_3F$, $Si_2F_6$, $SiCl_4$, $SiH_2Cl_2$, $SiH_3Cl$. Liquid material such as $SiCl_4$ is used after gasifying by the bubbling of an inert gas. As the gas used for forming plasma, there can be mentioned, for example, $H_2$, $F_2$, $Cl_2$, HF, HCl, He, Ne, Ar, Kr or Xe in addition to the starting gas described above.

As the starting gas in the case of depositing a thin film of amorphous silicon germanium, a gas mixture of the silicon atom-containing starting gas used for depositing the amorphous silicon as described above and germanium atom-containing gas, for example, $GeH_4$ or $GeF_4$ is used. As the gas used for forming the plasma, there can be mentioned $H_2$, $F_2$, $Cl_2$, HF, HCl, He, Ne, Ar, Kr or Xe in addition to the gas mixture of the silicon atom-containing gas and the germanium atom-containing gas.

As the starting gas for depositing the silicon nitride thin film, there may be used the silicon atomcontaining gas used for depositing the amorphous silicon as described above, or a gas mixture of at least one of gases containing nitrogen atoms, for example, $N_2$, $HN_3$, $HF_3$ and a silicon atom-containing gas. The gas used for forming the plasma can include, in addition to the starting gas as described above, $N_2$, $NH_3$, $HF_3$, $H_2$, $F_2$, $Cl_2$, HF, HCl, He, Ne, Ar, Kr or Xe. In the case of forming silicon nitride, it is necessary that the starting gas or plasma-generating gas contains at least nitrogen-containing gas and silicon-containing gas.

As the starting gas for depositing a silicon oxide thin film, there can be used the silicon atom-containing gas used for depositing amorphous silicon as described above, or a gas containing oxygen $O_2$ and silicon atoms. The gas used for forming the plasma can include, in addition to the starting material gas as described above, $O_2$, $H_2$, $F_2$, $Cl_2$, HF, HCl, He, Ne, Ar, Kr or Xe. In the case of forming silicon oxide, the starting gas or the plasma forming gas has to contain at least $O_2$ and silicon atomcontaining gas. As the starting gas in the case of depositing the amorphous silicon carbide thin film, there may be used the silicon atom-containing gas used for depositing amorphoüs silicon as described above, silicon atom- and carbon atom-containing gas such as $Si(CH_3)_4$, or a gas mixture comprising at least one of carbon atomcontaining gases selected from $CH_4$, $C_2H_2$, $C_2H_4$ or $C_2H_6$, and the silicon atom-containing gas as described above. The gas used for forming the plasma can also include, in addition to the starting gas described above, carbon atomcontaining gas, $H_2$, $F_2$, $Cl_2$, HF, HCl, He, Ne, Ar, Kr or Xe. In the case of forming amorphous silicon carbide, it is necessary that the starting gas or plasma-forming gas contains at least a carbon atom-containing gas and a silicon atom-containing gas.

As the starting gas for depositing a diamond thin film, there can be mentioned, $CH_4$, $C_2H_2$, $C_2H_4$, $C_2H_6$, $CH_3COCH_3$, $CH_3OH$, $CH_3COCH_3$ or $CH_3OH$ is used after gasifying by the bubbling of an inert gas. Further, as the gas for forming plasma, there may be mentioned, in addition to the carbon atom-containing gas described above, $H_2$, $F_2$, $Cl_2$, HF, HCl, He, Ne, Ar, Kr or Xe.

The starting gas used for forming the film described above may be used also as a gas for generating the plasma. Further, the film-forming starting gas may be diluted with an inert gas such as He or Ar. In the case of adding impurity into the deposited film, a gas such as $PH_3$, $PF_5$, $PF_3$, $PCl_3$, $PCl_5$, $B_2H_6$, $BF_3$, $BCl_3$, $BBr_3$, $AsF_5$, $AsCl_3$, $AsH_3$, $I_2$, $SbH_3$ or $SbF_5$ is mixed into the film-forming starting gas or plasma-forming gas. The pressure upon reaction for forming a thin film of amorphous silicon, crystalline silicon, amorphous silicon germanium, silicon nitride, silicon oxide or amorphous silicon carbide is preferably from $10^{-5}$ to $10^{-1}$ Torr.

The reaction pressure upon forming the diamond thin film is preferably from $10^{-3}$ to $10^2$ Torr.

Further, in the formation of the deposited film and etching by using the microwave plasma treating apparatus according to the present invention, heat energy or light energy may be applied to the surface of the substrate in order to promote the reaction.

ELECTRIC DISCHARGE TEST

An electric discharge test was conducted by using the microwave plasma treating apparatus according to the present invention shown in FIG. 1, while varying the kind of the gas and the pressure region in a case where the bell jar 105 had 100 mm diameter φ, taking notice on the maintenance of the electric discharge, reflection power and incident power. As a comparison, electric discharge test by detaching the magnetic field generator and TE mode electric discharge test by detaching the electromagnet in the microwave plasma apparatus shown in FIG. 4 were also conducted. $H_2$, Ar, $SiH_2Cl_2$ was used as the gas and introduced through the gas introduction pipe 110. The magnetic field generator of the type shown in FIG. 2 (B) having a central magnetic flux density at 150 gauss was used. The results of the electric discharge test are collectively shown in Table 1.

Further, in FIG. 1, by using the microwave plasma treating apparatus with the diameter φ of the bell jar 105 of 70 mm and the central magnetic flux density at 100 gauss, $H_2$ and Ar discharge was conducted to determine the relationship between the pressure and the electric power for maintaining the discharge. The results are shown in FIG. 5.

Figure 5:
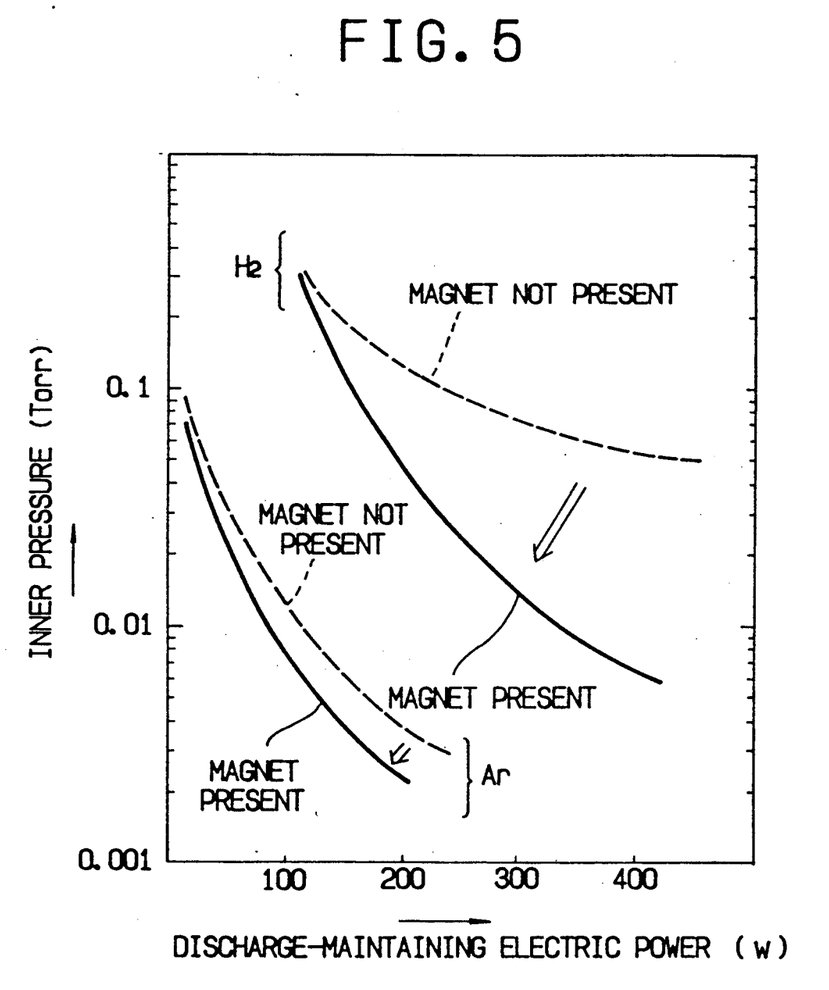
FIG. 5 is a chart collectively illustrating the results of electric discharge test for the apparatus according to the present invention.

It can be seen from the results of Table 1 and FIG. 5 that the reflection power can be restricted and electric discharge could be caused in a lower pressure region and with a lower electric power by using the microwave plasma treating apparatus according to the present invention disposed with the magnetic field generator.

When the same electric discharge test as above was conducted for the magnetic generator with the type other than that shown in FIG. 2(B), similar results with those for the type shown in FIG. 2(B) were obtained.

DEPOSITED FILM FORMING EXAMPLE 1

Using the apparatus shown in FIG. 1 used for electric discharge test and the magnetic field generator of a type shown in FIG. 2(G), formation of the amorphous silicon (a-Si) film was investigated.

At first, a cleaned #7059 glass substrate manufactured by Corning Glass Works and a high resistance silicon single crystal substrate were attached to the specimen holder 109, the inside of the vessel was evacuated to a high vacuum degree of $1 \times 10^{-6}$ Torr and the substrate temperature was controlled to 250° C. by a substrate heater not illustrated in FIG. 1. Then, 5 SCCM of $SiH_2Cl_2$ and 50 SCCM of $H_2$ were introduced from the gas introducing pipe 110, the pressure in the reaction vessel 107 was controlled to 0.05 Torr, the current for the magnetic field generator was controlled such that the magnetic flux density at the center of the discharging space in the bell jar 105 200 gauss. Then, a microwave at a frequency of 2.45 GHz was applied at 250 W power to conduct reaction for one hour to obtain an a-Si film of 1.2 um thickness (the reflection power was minimized during reaction by the power feedback mechanism).

The deposition rate was 3.3 Å/sec and the ratio δP/δd between the photoconductivity (δp) under light irradiation of AMI (100 mw/cm$^2$) and the dark conductivity (δd) was $1.1 \times 10^5$.

Separately, when an a-Si film is deposited by the same method as in the experimental method described above while detaching the magnetic field generator, the deposition rate was reduced to ⅓, that is, 1.5 Å/sec, the ratio δp/δd was $1.4 \times 10^3$ and broad absorption peak was observed near 1100 cm$^{-1}$ based on IR absorption spectrum for a-Si film formed on silicon single crystals.

It is assumed that since $SiH_2Cl_2$ as the starting gas was not completely decomposed and reacted in the case not using the magnetic field generator, Cl atoms remained in the deposited film, which were hydrolyzed when exposed to air thereby forming Si-O-bonds.

DEPOSITED FILM FORMING EXAMPLE 2

Figure 2A:
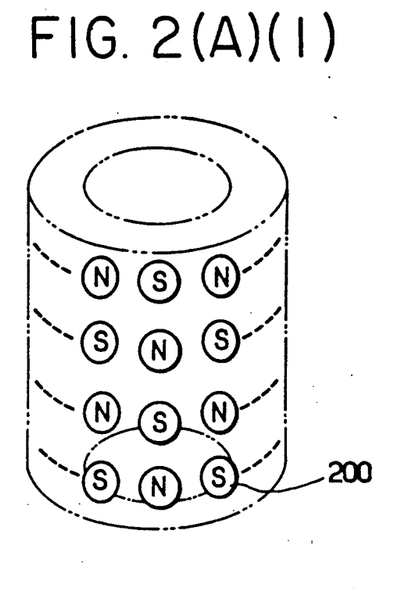
FIG. 2(A) through FIG. 2(H) are schematic constitutional views, respectively, for the magnetic field generating device in the apparatus according to the present invention.
Figure 2B:
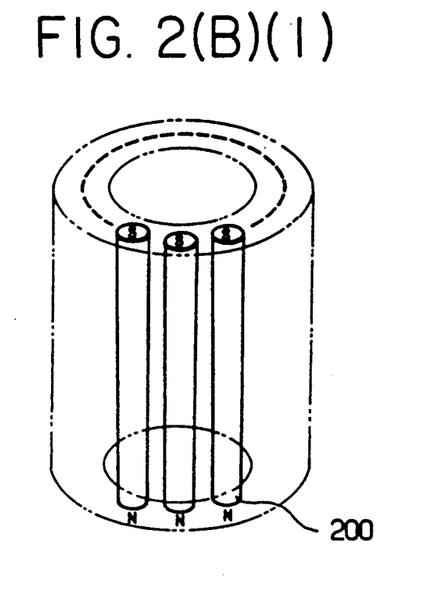
Figure 2C:
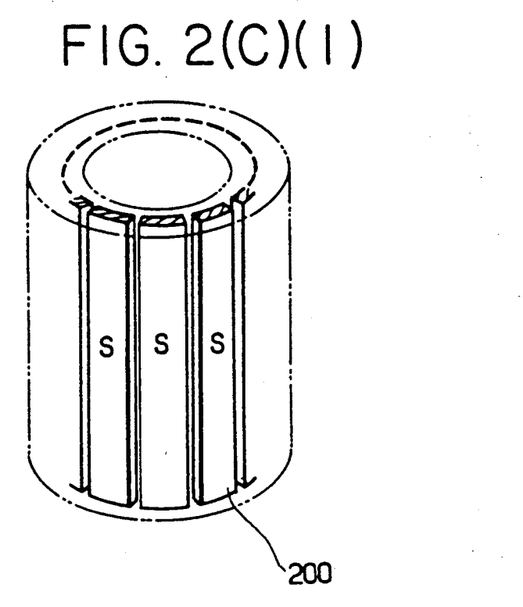
Figure 2D:
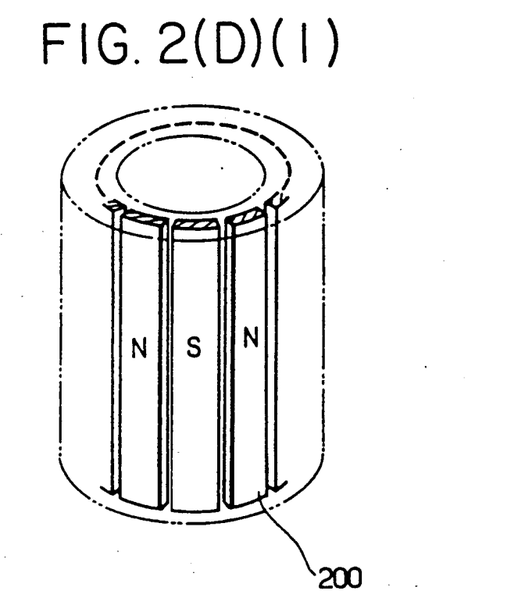
Figure 2E:
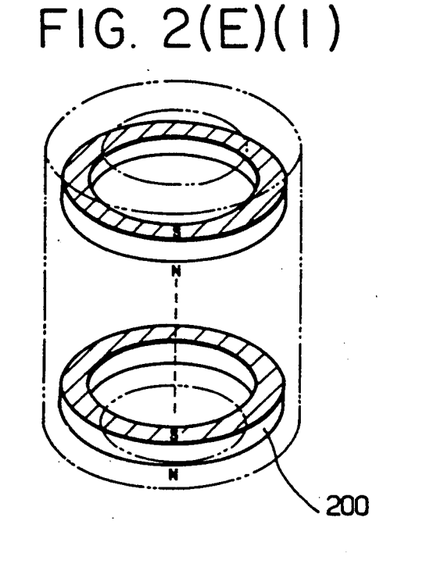
Figure 2F:
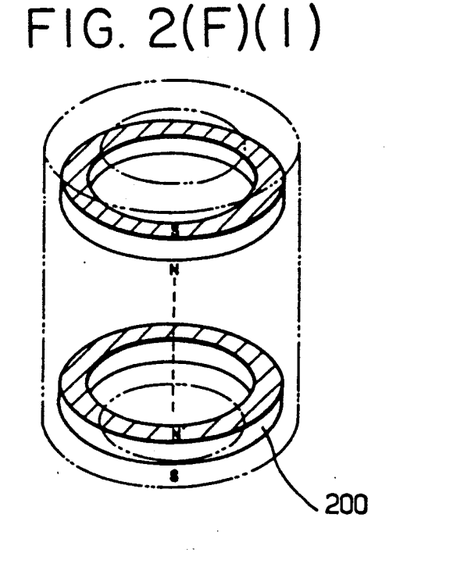
Figure 2G:
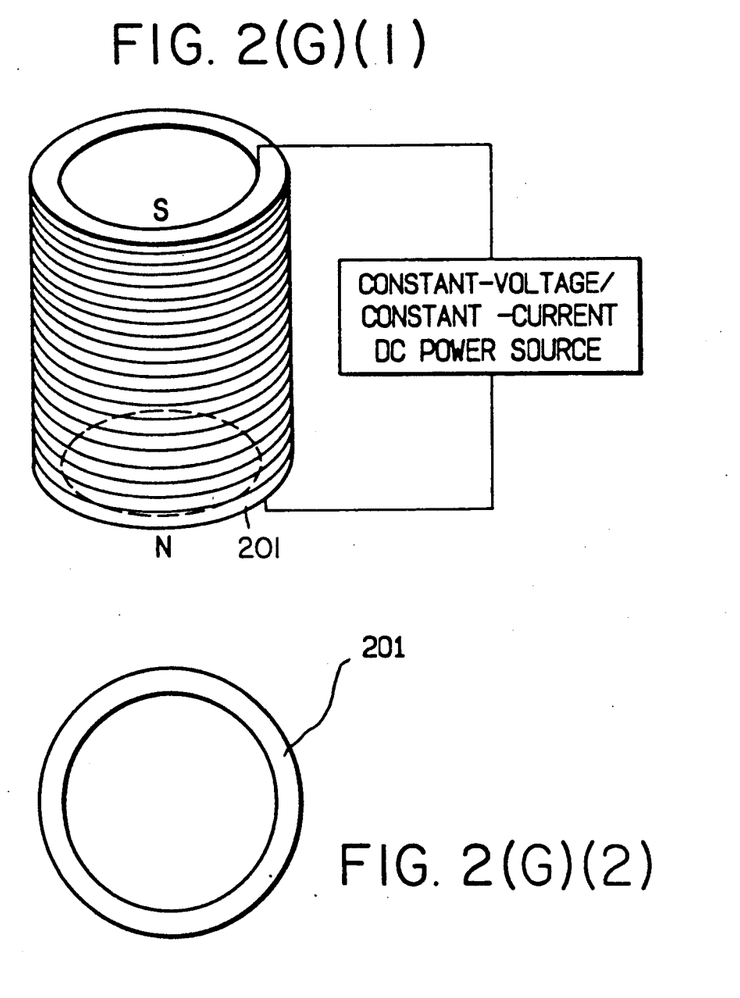
Figure 2H:
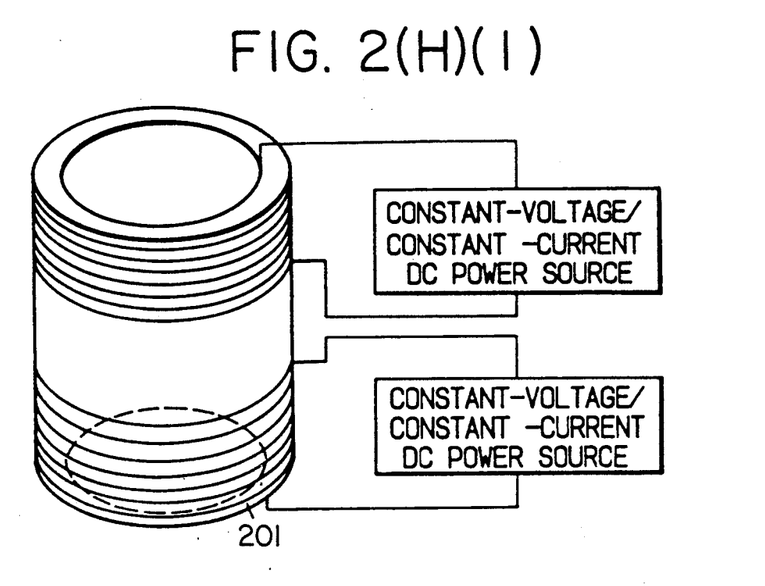

In the apparatus shown in FIG. 1, forming for polysilicon (poly-Si) film was studied by using a mirror type magnetic field generator of a type illustrated in FIG. 2(H), in which identical magnetic poles are formed from first and second solenoid coils. In the same method as in the deposited film forming example, a #7059 glass substrate and a silicon single crystal substrate were attached to the specimen holder 109. The inside of the vessel was evacuated to a high vacuum degree of $1 \times 10^{-6}$ Torr. The substrate temperature was controlled to 300° C., the pressure in the reaction vessel 107 was maintained at 0.005 Torr and the current for the magnetic field generator was controlled to attain the magnetic flux density to 200 gauss at the center of the discharging space in the bell jar 105. Then, 100 SCCM of $H_2$ was introduced from the gas introducing pipe 110 and 10 SCCM of $Si_2F_6$ after heated to 700° C. was introduced from the gas introducing pipe 111, a microwave of 2.45 GHz was charged at 300 W power and reaction was conducted for one hour. The thickness of the resultant silicon film was 6000 Å and, as a result of the evaluation for the crystallinity according to RHEED (reflection high speed electron rate diffractiometry). It was found that an epitaxial film was grown on the (110) silicon single crystal substrate and (110) oriented polycrystalline film was grown on the #7050 glass substrate.

DEPOSITED FILM FORMING EXAMPLE 3

Deposition of a silicon nitride film was investigated by using the apparatus shown in FIG. 1 provided a with magnetic field generator of a type illustrated in FIG. 2(A) having the 1000 gauss of central magnetic flux density.

At first, a cleaned single crystal silicon substrate was attached to the specimen holder 109 and the inside of the vessel was evacuated to a high vacuum degree of $1 \times 10^{-6}$ Torr. The substrate temperature was controlled to 250° C., 100 SCCM of $N_2$ and 10 SCCM of $NH_3$ were introduced from the gas introducing pipe 110, while 5 SCCM of $SiH_4$ was introduced from the gas introducing pipe 111, the pressure in the reaction vessel 107 was controlled to 0.02 Torr and a microwave of 2.45 GHz was applied at 250 W of electric power. After reaction for 30 min, the thickness of the resultant silicon nitride film was 6800 Å. The etching rate with a fluoric acid buffer solution (50% HF: 40% $NH_4F = 15 : 85$) was 92 Å/min and a silicon nitride film having a film quality substantially equal to that formed by the thermal CVD method was obtained.

ETCHING EXAMPLE 1

Using the same apparatus as that used for the electric discharge test, dry etching for the silicon nitride film was investigated.

Photoresist (OFPR-800, manufactured by Tokyo Ohka Co.) was coated on a silicon nitride film formed on a single crystal silicon wafer and a resist pattern was formed by photolithography. A silicon nitride substrate masked with the resist pattern was attached to the specimen holder 109, the vessel was evacuated to $1 \times 10^{-5}$ Torr, 50 SCCM of $CF_4$ was introduced from the gas introduction pipe 110, the pressure in the reaction vessel 107 was controlled to 0.005 Torr and a microwave of 0.45 GHz was charged at 3000 W of electric power. The etching reaction was conducted for 5 min, the nitride silicon substrate was taken out and, after removing the resist, the step in the silicon nitride film was measured to calculate the etching rate as 1100 Å/min.

TAs the result of the etching reaction conducted in the same procedure as described above except for detaching the magnetic field generator, the etching rate was 470 Å/min and the effect of attaching the magnetic field generator was recognized.

In the Deposition Film Forming Examples 1, 2 and 3, examples for forming amorphous silicon, polysilicon and silicon nitride were shown, respectively, and an example for etching silicon nitride was shown in Etching Example 1. However, the present invention is not restricted to them but also effective to the formation of silicon oxide, amorphous silicon carbide and diamond or various etching for metals.

TABLE 1

| | | | TE mode | | |
|---|---|---|---|---|---|
| No. | Gas used/ flow rate (SCCM) | Inner pressure (Torr) | Incident power (W) / Reflection power (W) | Electric discharge (○) (X) | $1 - \frac{\text{Reflection power (W)}}{\text{Incident power (W)}}$ |
| 1 | Ar/50 | 0.005 | 182/90 | ○ | 0.51 |
|   |       | 0.002 | —      | X |   —   |
| 2 | H$_2$/50 | 0.020 | — | X | — |
|   |          | 0.005 | — | X | — |
| 3 | He/50 | 0.070 |   |   |   |
|   |       | 0.020 |   |   |   |
| 4 | H$_2$/50 | 0.020 |   |   |   |
|   | He/40   | 0.010 |   |   |   |
|   | Ar/10   |       |   |   |   |
| 5 | SiH$_2$Cl$_2$/10 | 0.020 |   |   |   |
|   | H$_2$/50         | 0.005 |   |   |   |

| | | | Without magnetic field generator | | |
|---|---|---|---|---|---|
| No. | Gas used/ flow rate (SCCM) | Inner pressure (Torr) | Incident power (W) / Reflection power (W) | Electric discharge (○) (X) | $1 - \frac{\text{Reflection power (W)}}{\text{Incident power (W)}}$ |
| 1 | Ar/50 | 0.005 | 178/33 | ○ | 0.81 |
|   |       | 0.002 | 190/22 | ○ | 0.88 |
| 2 | H$_2$/50 | 0.020 | 430/150 | ○ | 0.65 |
|   |          | 0.005 | —       | X | —    |
| 3 | He/50 | 0.070 | 335/75 | ○ | 0.78 |
|   |       | 0.020 | —      | X | —    |
| 4 | H$_2$/50 | 0.020 | 320/150 | ○ | 0.54 |
|   | He/40    | 0.010 | 325/200 | instable discharge | 0.38 |
|   | Ar/10    |       |         |   |      |
| 5 | SiH$_2$Cl$_2$/10 | 0.020 | 380/100 | ○ | 0.74 |
|   | H$_2$/50         | 0.005 | —       | X | —    |

| | | | With magnetic field generator (present invention) | | |
|---|---|---|---|---|---|
| No. | Gas used/ flow rate (SCCM) | Inner pressure (Torr) | Incident power (W) / Reflection power (W) | Electric discharge (○) (X) | $1 - \frac{\text{Reflection power (W)}}{\text{Incident power (W)}}$ |
| 1 | Ar/50 | 0.005 | 172/26 | ○ | 0.85 |
|   |       | 0.002 | 183/18 | ○ | 0.90 |
| 2 | H$_2$/50 | 0.020 | 450/30  | ○ | 0.93 |
|   |          | 0.005 | 340/160 | ○ | 0.53 |
| 3 | He/50 | 0.070 | 320/40  | ○ | 0.88 |
|   |       | 0.020 | 330/175 | ○ | 0.47 |
| 4 | H$_2$/50 | 0.020 | 280/85 | ○ | 0.70 |
|   | He/40    | 0.010 | 145/35 | ○ | 0.76 |
|   | Ar/10    |       |        |   |      |
| 5 | SiH$_2$Cl$_2$/10 | 0.020 | 370/55  | ○ | 0.85 |
|   | H$_2$/50         | 0.005 | 280/115 | ○ | 0.59 |

What is claimed is:

1. A microwave plasma treating apparatus comprising a vacuum vessel, having a cavity resonator and a waveguide, means for introducing a microwave to the inside of said vacuum vessel by way of a microwave transmission circuit, means for supplying a starting gas to the inside of said vacuum vessel, means for evacuating the inside of said vacuum vessel, and a specimen holder for maintaining a specimen substrate in the inside of said vacuum vessel, wherein said cavity resonator is integrated with two matching circuits and disposed in said microwave transmission circuit, a magnetic field generator for generating a magnetic field in the discharging space inside of said cavity resonator is disposed to the outside of said cavity resonator, said two matching circuits integrated with said cavity resonator comprising an axial length varying plunger and a sliding type iris for said cavity resonator.

2. A microwave plasma treating apparatus as defined in claim 1 wherein the cavity resonator is cylindrical and the sliding type iris constitutes a cylindrical sliding type iris.

3. A microwave plasma treating apparatus as defined in claim 1, wherein the cavity resonator is rectangular and the sliding type iris comprises a planar sliding type iris.

4. A microwave plasma treating apparatus as defined in claim 1, wherein the means for introducing the microwave comprises a continuously oscillating microwave generator and a microwave transmissive bell jar for forming the discharging space is disposed within the cavity resonator.

5. A microwave plasma treating apparatus as defined in claim 1, wherein power monitor means is disposed in the microwave transmission circuit and a feedback control mechanism is provided for applying coarse control by a plunger for varying the length of the cavity resonator and, successively, applying fine control by a matching circuit disposed separately in order to reduce the value: (reflection power)/(incident power) based on the signal from said power monitor means.

6. A feedback control system in a microwave plasma treating apparatus as defined in claim 1, wherein a power monitor means is disposed in the microwave transmission circuit and coarse control is applied from a plunger for varying the length of the cavity resonator and successively, fine control is applied by a separately provided matching circuit in order to decrease the value: (reflection power)/(incident power) based on the signal from said power monitor means.

7. The microwave plasma treating apparatus of claim 1 including means for depositing a film on the specimen substrate.

8. The microwave plasma treating apparatus of claim 1 including means for etching the specimen.

* * * * *

UNITED STATES PATENT AND TRADEMARK OFFICE
CERTIFICATE OF CORRECTION

PATENT NO. : 5,038,713

DATED : August 13, 1991

INVENTOR(S) : SOICHIRO KAWAKAMI, ET AL.

It is certified that error appears in the above-identified patent and that said Letters Patent is hereby corrected as shown below:

COLUMN 1

Line 46, "$10^8$ to 10cm$^{-3}$ decom-" should read --$10^8$ to $10^{10}$ cm$^{-3}$, the decom- --.

COLUMN 2

Line 3, "is a" should read --is of a--.
Line 11, "No. (62-36240)." should read --No. 62-36240).--.
Line 16, "exhaust pipe 307B" should read --exhaust pipe 307b--.
Line 57, "watercooled" should read --water-cooled--.

COLUMN 3

Line 27, "drawbacks;" should read --drawbacks:--.
Line 30, "cross sectional" should read --cross-sectional--.
Line 32, "discharge:" should read --discharge;--.
Line 50, "discharge:" should read --discharge;--.
Line 55, "cult:" should read --cult;--.

COLUMN 4

Line 9, "cross" should read --cross- --.
Line 28, "resides" should read --reside--.
Line 31, "and circuit" should read --and a matching circuit-- and "irises," should read --iris,--.
Line 33, "esonator" should read --resonator--.
Line 34, "a penetrating" should read --penetrating a--.
Line 45, "cross sec-" should read --cross-sec- --.

UNITED STATES PATENT AND TRADEMARK OFFICE
CERTIFICATE OF CORRECTION

PATENT NO. : 5,038,713

DATED : August 13, 1991

INVENTOR(S) : SOICHIRO KAWAKAMI, ET AL.

It is certified that error appears in the above-identified patent and that said Letters Patent is hereby corrected as shown below:

COLUMN 5

Line 26, "correspondingly" should read --correspondingly.--.
    Line 36, "($TM_{rst}$) the" should read --$TM_{rst}$) and the--.

COLUMN 6

Line 45, "electromagnent" should read --electromagnet--.
    Line 51, "treating," should read --treating--.
    Line 58, "details," should read --detail,--.

COLUMN 7

Line 11, "invention comprises" should read --invention which comprises--.

COLUMN 8

Line 43, "22" should be deleted.
    Line 51, "cross sectional" should read --cross-sectional--.

COLUMN 10

Line 4, "atomcontaining" should read --atom-containing--.
    Line 24, "atomcontaining" should read --atom-containing--.
    Line 30, "atomcontaining" should read --atom-containing--.
    Line 34, "atomcontaining" should read --atom-containing--.

COLUMN 11

Line 51, "jar 105 200 gauss" should read --jar 105 was 200 gauss--.
    Line 59, "$\delta P/\delta d$" should read --$\delta p/\delta d$--.

UNITED STATES PATENT AND TRADEMARK OFFICE
CERTIFICATE OF CORRECTION

PATENT NO. : 5,038,713
DATED : August 13, 1991
INVENTOR(S) : SOICHIRO KAWAKAMI, ET AL.

It is certified that error appears in the above-identified patent and that said Letters Patent is hereby corrected as shown below:

COLUMN 12

Line 30, "diffractiometry). It" should read --diffractiometry), it--.
    Line 33, "#7050 glass" should read --#7059 glass--.
    Line 37, "a with" should read --with a--.

COLUMN 13

Line 8, "TAs" should read --That as--.

COLUMN 14

Line 13, "claim 1" should read --claim 1,--.

Signed and Sealed this

Sixth Day of April, 1993

*Attest:*

STEPHEN G. KUNIN

*Attesting Officer*    *Acting Commissioner of Patents and Trademarks*